US006870433B2

(12) United States Patent
Motz

(10) Patent No.: US 6,870,433 B2
(45) Date of Patent: Mar. 22, 2005

(54) OSCILLATOR CIRCUIT

(75) Inventor: Mario Motz, Wernberg (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/337,195

(22) Filed: Jan. 6, 2003

(65) Prior Publication Data

US 2003/0155986 A1 Aug. 21, 2003

Related U.S. Application Data

(63) Continuation of application No. PCT/DE01/02439, filed on Jun. 29, 2001.

(30) Foreign Application Priority Data

Jul. 5, 2000 (DE) .......................................... 100 32 526

(51) Int. Cl.[7] ................................................ H03K 3/26
(52) U.S. Cl. ....................... 331/111; 331/143; 331/36 C
(58) Field of Search ................................. 331/111, 143, 331/36 C, 18, 176

(56) References Cited

U.S. PATENT DOCUMENTS

| 4,205,279 A | | 5/1980 | Beutler | 331/111 |
|---|---|---|---|---|
| 4,316,155 A | * | 2/1982 | Hanisko | 331/18 |
| 4,734,656 A | * | 3/1988 | Miller | 331/111 |
| 5,459,437 A | | 10/1995 | Campbell | 331/111 |
| 5,570,067 A | | 10/1996 | Shacter | 331/111 |
| 5,886,556 A | | 3/1999 | Ganger et al. | 327/206 |
| 6,157,270 A | * | 12/2000 | Tso | 331/176 |

FOREIGN PATENT DOCUMENTS

JP 58145221 8/1983

OTHER PUBLICATIONS

Ferri, G. et al.: "A Novel Low Voltage Low Power Oscillator as a Capacitive Sensor Interface for Portable Applications", Sensors and Actuators 76, Elsevier, 1999, pp. 437–441.
Tietze et al.: "Halbleiterschaltungstechnik" (Semiconductor Circuit Technology), Springer Verlag, Ed, 10, p. 189.
Allen, P. E. et al.: "CMOS Analog Circuit Design", Oxford University Press, pp. 633–655.
Flynn, M. P. et al.: "A 1.2–$\mu$m CMOS Current–Controlled Oscillator", IEEE Journal of Solid–State Circuits 27, New York, Jul. 1992, No. 7, pp. 982–987.

* cited by examiner

Primary Examiner—Arnold Kinkead
(74) Attorney, Agent, or Firm—Laurence A. Greenberg; Werner H. Stemer; Gregory L. Mayback

(57) ABSTRACT

An oscillator circuit having a charge storage device, an upward integration current source, and a downward integration current source is described. The charge storage device is also connected to a comparator in order to drive the current sources as a function of a lower comparator threshold and an upper comparator threshold. In consequence, a triangular waveform voltage is formed across the charge storage device, on the basis of the relaxation principle. The difference voltage from the two comparator thresholds is dropped across a first resistor. Since the comparator itself as well as the lower and upper current thresholds are formed in a common current path, this oscillator circuit has a particularly low current draw.

9 Claims, 1 Drawing Sheet

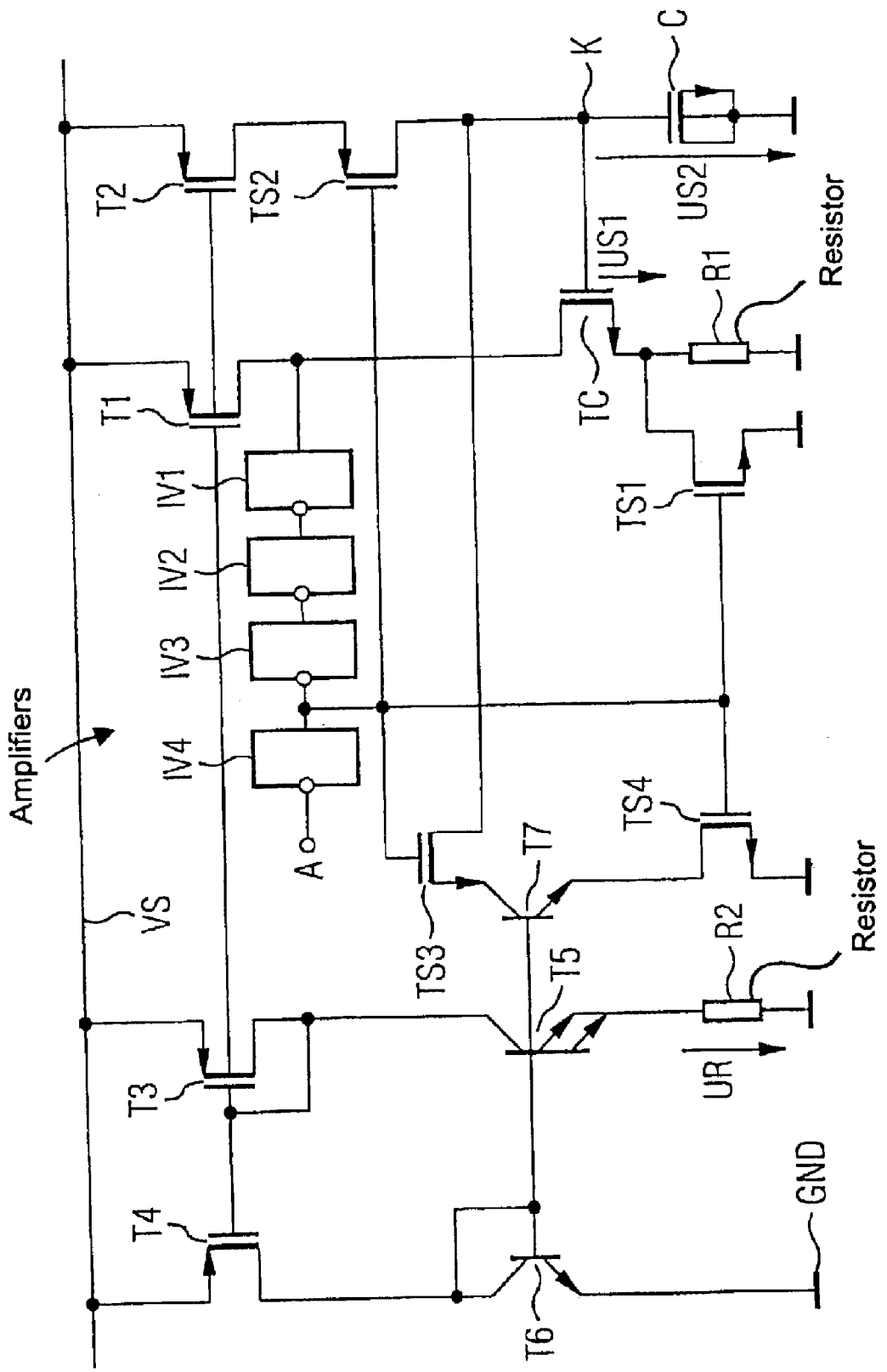

US 6,870,433 B2

OSCILLATOR CIRCUIT

CROSS-REFERENCE TO RELATED APPLICATION

This application is a continuation of copending International Application No. PCT/DE01/02439, filed Jun. 29, 2001, which designated the United States and was not published in English.

BACKGROUND OF THE INVENTION

Field of the Invention

The present invention relates to an oscillator circuit having a charge storage device, an upward integration current source and a downward integration current source which are each connected to the charge storage device for charging and discharging, respectively, and a comparator which is connected to the charge storage device for driving the upward and downward integration current sources as a function of a lower comparator threshold and an upper comparator threshold.

Integrated oscillator circuits such as these, which operate on the basis of the relaxation principle, are described, for example, in the article "A 1.2-$\mu$m CMOS Current-Controlled Oscillator", Michael P. Flynn, IEEE Journal of Solid-State Circuits, Vol. 27, No. 7, July 1992, pages 982 et seq. In this case, the charge storage device is a capacitor across which a triangular waveform voltage is produced by charging and discharging the capacitor.

An oscillator circuit is also described in the article "A novel low voltage low power oscillator as a capacitive sensor interface for portable applications", Guiseppe Ferri, Sensors and Actuators 76 (1999) pages 437–441.

The principle of a univibrator on which these oscillators are based is described in Tietze, Schenk: Halbleiterschaltungstechnik [Semiconductor Circuit Technology], $10^{th}$ Edition, Springer-verlag, page 189, FIG. 8.54.

The described oscillators have the disadvantage that they require a large area on the chip surface since high-value resistors are required to produce the oscillator circuits. Furthermore, the described oscillators have a relatively high current draw as a result of the restriction of the chip surface area for the required resistors and the current draw for producing reference voltages, reference currents and comparator currents. The relatively high current draw of the described oscillator circuits is due to the fact that there are a large number of other current paths in addition to the current path that is required for charging the integration capacitance.

In order to provide a standby mode for an integrated circuit, in which the circuit switches back to a normal mode after a time that can be predetermined, it is necessary to keep an internal oscillator operating all the time. This internal oscillator is subject to requirements for a low current draw and a low operating voltage, and for it to be independent of operating voltage fluctuations, temperature fluctuations and technical scatters. A further goal is to produce an oscillator that occupies little chip surface area and can be produced cost-effectively.

SUMMARY OF THE INVENTION

It is accordingly an object of the invention to provide an oscillator circuit which overcomes the above-mentioned disadvantages of the prior art apparatus of this general type.

In particular, it is an object of the invention to provide an oscillator circuit of the generic type described above such that it occupies little chip surface area, has a low current draw, is suitable for low operating voltages, and is designed to be independent of fluctuations in the operating voltage.

With the foregoing and other objects in view there is provided, in accordance with the invention, an oscillator circuit including: a charge storage device; an upward integration current source connected to the charge storage device for charging the charge storage device; a downward integration current source connected to the charge storage device for discharging the charge storage device; a comparator connected to the charge storage device for driving the upward integration current source as a function of a lower comparator threshold and for driving the downward integration current source as a function of an upper comparator threshold; and a common current path having the comparator formed therein. The lower comparator threshold and the upper comparator threshold are obtained from the common current path.

For an oscillator circuit as specified initially, the invention is achieved by forming the comparator and the low and upper comparator thresholds in a common current path.

The implementation of the comparator function as well as the upper and lower comparator thresholds in a common current path has, in particular, the advantage that the oscillator circuit has a low current draw.

In one advantageous development of the present invention, the charge storage device is in the form of a gate oxide capacitance. A gate oxide capacitance occupies a particularly small chip surface area.

In a further advantageous embodiment of the present invention, the bias voltage that is required for the charge storage device can be produced in the common current path. This leads to a further reduction in the current drawn by the oscillator circuit.

In a further advantageous embodiment of the present invention, the common current path has an MOS transistor whose gate connection is connected to the charge storage device, whose drain connection is connected to a supply potential, and whose source connection is connected to a first resistor that is connected to a reference ground potential. A difference voltage is formed from the difference from the lower and upper comparator thresholds and this difference voltage is dropped across the first resistor. Since only one threshold voltage of one MOS transistor is connected in series in the common current path between the supply potential and the reference ground potential, the described circuit arrangement is suitable for particularly low operating voltages. If a bipolar transistor is used instead of the MOS transistor as the comparator, then only one base/emitter voltage is connected in series between the supply potential and the reference ground potential. If a gate oxide capacitance is used as the charge storage device, then the MOS transistor that is used as the comparator can also be used to produce precisely the required bias voltage for the gate oxide capacitance.

In a further advantageous embodiment of the present invention, a band gap reference circuit is provided for producing a reference voltage. Band gap reference circuits ate distinguished in that they can produce a particularly narrow-tolerance and stable reference voltage.

In a further advantageous embodiment of the present invention, a current mirror is connected on one side to the band gap reference circuit and on the other side to the first resistor. The current mirror allows the reference voltage that can be produced by the band gap reference circuit to be mirrored across the first resistor, so that the threshold difference voltage that is dropped across the first resistor is proportional to the reference voltage. This means that it is possible to set particularly precise comparator thresholds.

If bipolar transistors are used to provide the current mirror, then the mirror ratio can be set by the area ratio of the transistors. If MOS transistors are used instead of the bipolar transistors, the transistor mirror ratio can be set by the channel-width to channel-length ratio of the transistors. The difference voltage that can be produced across the first resistor using the band gap circuit is independent of both the technology and the operating voltage.

In a further advantageous embodiment of the present invention, a first switch is provided for switching between the lower and upper comparator thresholds. The first switch may be in the form of a transistor switch whose load path is arranged in parallel with the first resistor, across which the difference voltage is dropped. The input of the first switch can be connected to one output of the comparator.

In a further advantageous embodiment of the present invention, a second switch is provided for switching the upward integration current source on and off, and a third switch is provided for switching the downward integration current source on and off. The second and third switches may be in the form of MOS transistor switches. The second and third switches may be omitted if the magnitudes of the currents through the upward and downward integration sources are asymmetric.

In a further advantageous embodiment of the present invention, at least one amplifier has an output connected to the comparator. The amplifier may be an inverting amplifier. The output of the inverting amplifier may be connected to the input of the first switch. The output of the first amplifier may be connected to the control inputs of the second and third switches.

The gate oxide capacitance may have the same vertical structure as the MOS transistor that is used as the comparator.

The oscillator frequency of the described oscillator circuit is calculated from twice the product of the resistance value of the first resistor and the capacitance value of the charge storage device.

The integrating response results in a triangular waveform voltage being formed across the charge storage device.

In order to reduce the current further, an additional switch may be provided, whose control connection is connected to the control connection of the first switch.

Other features which are considered as characteristic for the invention are set forth in the appended claims.

Although the invention is illustrated and described herein as embodied in a oscillator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The sole drawing FIGURE is a circuit diagram of an exemplary embodiment of an oscillator circuit.

DESCRIPTION OF THE PREFERRED EMBODIMENTS

Referring now to the sole drawing FIGURE, there is shown a charge storage device C, which is connected to a reference ground potential GND and to a node K. The node K is connected to the control input, in this case to the gate connection, of a comparator TC. The node K is also connected to an upward integration current source T2, which is in the form of a MOS transistor, and to a downward integration current source T7, which is in the form of a bipolar transistor. The current sources T2, T7 are in this case connected via respective switching transistors TS2, TS3 to the node K and to the capacitance C. The switches TS2, TS3 that are provided for switching the current sources are in the form of MOS transistors. In each case, one load connection of one current source is connected to one load connection of the second and third switches. One of the load connections of the MOS transistor TC that forms the comparator is connected via a first resistor R1 to the reference ground potential GND and the other one of the load connections is connected to a first amplifier, preferably in the form of an inverter IV1. A band gap reference circuit T3, T4, T5, T6, R2 is provided for producing a reference voltage. This band gap reference circuit T3, T4, T5, T6, R2 has two MOS transistors T3, T4 and two bipolar transistors T5, T6. The control connections of the MOS transistors T3, T4 are connected to one another and the control connections of the bipolar transistors T5, T6 are connected to one another. One load connection in each case of one bipolar transistor T5, T6 is connected to one load connection in each case of one MOS transistor T3, T4. One (T3) of the two MOS transistors T3, T4 and one (T6), of the two bipolar transistors T5, T6 in the band gap reference circuit in each case has a control connection that is connected to one of its load connections. In order to ensure suitability for low supply voltages, only a maximum of one threshold voltage or one base/emitter voltage is in this case connected in series between the reference ground potential GND and the supply potential. The band gap reference circuit produces a reference voltage UR across the second resistor R2, which reference voltage UR is a PTAT (Proportional To Absolute Temperature) voltage and has a value of a few tens of millivolts. This PTAT reference voltage UR is mirrored by a current mirror T1, T3 such that a difference voltage which is proportional to the reference voltage UR is dropped across the first resistor R1, which is connected to the MOS transistor TC. This difference voltage is the difference between the lower and upper comparator threshold voltages US1, US2. The lower comparator threshold is in this case calculated from the sum of the threshold voltage of the transistor TC and the effective gate/source voltage of the MOS transistor TC. The upper comparator threshold voltage US2 is calculated from the sum of the lower comparator threshold voltage US1 and the voltage across the first resistor R1.

The output of the MOS transistor TC is connected via three amplifiers, preferably in the form of inverters IV1, IV2, IV3, to the control inputs of the second and third switches TS2, TS3, which switch the current sources T2, T7 on and off. The downward integration on the gate oxide capacitance C takes place after reaching the upper comparator threshold US2, and the upward integration on the gate oxide capacitance C takes place after reaching the lower comparator threshold US1. The current sources T2, T7 charge the gate oxide capacitance C with a constant current, so that a triangular waveform voltage is formed across the gate oxide capacitance C. The frequency of this oscillator triangular waveform voltage is 2·R1·C, where R1 is the resistance value of the first resistor R1 and C is the capacitance value of the gate oxide capacitance C. The gate oxide capacitance C is constructed vertically, in the same way as the transistor TC, in order to compensate manufacturing tolerances and temperature effects.

The respective control connections of the current sources T2, T7 are connected to the band gap reference circuit, in order to produce a referenced current. The control connection of the first switch TS1, which is connected in parallel with the first resistor R1 in order to switch between the upper and lower comparator thresholds US2, US1, is connected to the output of the third inverter IV3 and to the control input of a fourth switch TS4. The fourth switch TS4, which is in the form of an MOS transistor, is used to reduce the base current for the two bipolar transistors T5, T6 in the band gap reference circuit. The output of the third inverter IV3 is connected to a fourth inverter IV4, at whose output A an amplified signal at the oscillator frequency can be tapped off.

In an alternative embodiment of the present invention, the bipolar transistors T5, T6 in the band gap reference circuit, as well as the downward integration current source T7, may be replaced by MOS transistors which are operated in weak inversion.

The transistor switches TS1, TS2, TS3, TS4 may also be formed by other switches.

In addition to switching the current sources T2, T7 in the drain path and collector path, respectively, of the current sources on and off as described, the second and third switches TS2, TS3 may be arranged in the source path and in the emitter path, respectively, of the current sources T2, T7.

The first switch TS1 shorts out the threshold difference voltage, which is dropped across the first resistor R1 in every alternate half-clock phase.

Digital gates may be provided instead of the amplifier stages IV1 to IV4.

The bias voltage that is required for operating the gate oxide capacitance C is equal to the sum of the threshold voltage and the effective gate voltage of the MOS transistor TC. In consequence, it is independent of technology and temperature parameters and can be matched in a simple manner to the respectively required bias voltage for the gate oxide capacitance which is used as the integration capacitance.

The common current path which is formed from the current mirror transistor T1, the MOS transistor TC and the first resistor R1 is at the same time used to form the comparator thresholds, to provide the comparator function itself and to produce a bias voltage which is required for the gate oxide capacitance C. Transistor TC at the same time forms a comparator input and the mechanism for producing the bias voltage. Since the comparator threshold voltage difference which is dropped across the first resistor R1 is derived by mirroring from the reference voltage UR which is dropped across the second resistor R2 and is formed in the band gap reference circuit, the comparator threshold difference voltage which is dropped across the first resistor R1 is independent of technology parameter fluctuations, is independent of fluctuations in the operating voltage or in the supply potential VS, and can be produced with a determined temperature profile. Apart from the oscillator frequency being dependent on the first resistor and the capacitance C, the oscillator frequency is not subject to any other technology parameters.

The temperature coefficient of the oscillator frequency can be set by the appropriate series connection and parallel connection of resistors with different temperature coefficients in each case for the first resistor R1 and for the second resistor R2. In this case, the relatively low temperature coefficient of the gate oxide capacitance C may be ignored or also included.

The circuit shown in the FIGURE does not have more than one threshold voltage of one MOS transistor or base/emitter voltage of one bipolar transistor in series in any current path between the supply and reference-ground potentials VS, GND. In consequence, the described circuit is suitable for very low supply voltages. The described, common current path for the comparator, comparator thresholds and bias voltage leads to the described oscillator drawing very little current, so that it is suitable for a standby mode.

Furthermore, the described oscillator circuit occupies only a small chip surface area.

The described configuration with two band gap reference circuits makes it possible to produce small, very accurate currents while occupying only a small chip surface area. A voltage which is only a few tens of millivolts, but which is very accurate at the same time, is produced across the second resistor R2. The voltage that is dropped across R2 is largely independent of manufacturing and technology parameters, and its temperature response is determined exactly.

I claim:

1. An oscillator circuit, comprising:
   a charge storage device;
   an upward integration current source connected to said charge storage device for charging said charge storage device;
   a downward integration current source connected to said charge storage device for discharging said charge storage device;
   a comparator connected to said charge storage device for driving said upward integration current source as a function of a lower comparator threshold and for driving said downward integration current source as a function of an upper comparator threshold; and
   a common current path having said comparator formed therein;
   said lower comparator threshold and said upper comparator threshold being obtained from said common current path.

2. The oscillator circuit according to claim 1, wherein said charge storage device is a gate oxide capacitance.

3. The oscillator circuit according to claim 1, wherein said common current path produces a bias voltage required for said charge storage device.

4. The oscillator circuit according to claim 1, comprising:
   a first resistor connected to a reference ground potential;
   said common current path including an MOS transistor having a gate connection connected to said charge storage device, a drain connection for being connected to a supply potential, and a source connection connected to said first resistor; and
   said first resistor for dropping a difference voltage formed from a difference between said lower comparator threshold and said upper comparator threshold.

5. The oscillator circuit according to claim 4, comprising a band gap reference circuit for producing a reference voltage.

6. The oscillator circuit according to claim 5, comprising a current mirror having a side connected to said band gap reference circuit and another side connected to said first resistor.

7. The oscillator circuit according to claim 1, comprising a first switch for switching between said lower comparator threshold and said upper comparator threshold.

8. The oscillator circuit according to claim 1, comprising:
   a switch for switching said upward integration current source on and off; and
   another switch for switching said downward integration current source on and off.

9. The oscillator circuit according to claim 1, comprising at least one amplifier connected to said comparator.

* * * * *